United States Patent [19]

Hosten

[11] Patent Number: 4,832,811
[45] Date of Patent: May 23, 1989

[54] ELECTROPLATING APPARATUS FOR PLATE-SHAPED WORKPIECES, PARTICULARLY PRINTED CIRCUIT BOARDS

[75] Inventor: Daniel Hosten, Handzame, Belgium

[73] Assignee: Siemens Aktiengesellschaft, Berlin and Munich, Fed. Rep. of Germany

[21] Appl. No.: 147,294

[22] Filed: Jan. 22, 1988

[30] Foreign Application Priority Data

Jan. 26, 1987 [DE] Fed. Rep. of Germany ....... 3702229

[51] Int. Cl.⁴ .............................................. C25D 17/00
[52] U.S. Cl. .................................................. 204/198
[58] Field of Search ................................ 204/198, 206

[56] References Cited

U.S. PATENT DOCUMENTS

| | | | |
|---|---|---|---|
| 3,535,222 | 10/1970 | Cooke et al. | 204/207 |
| 3,650,935 | 3/1972 | Andersson | 204/206 |
| 4,347,115 | 8/1982 | Espenhahn et al. | 204/206 |
| 4,385,967 | 5/1983 | Brady et al. | 204/27 |
| 4,401,523 | 8/1983 | Avellone | 204/15 |

FOREIGN PATENT DOCUMENTS

| | | |
|---|---|---|
| 0039453 | 11/1981 | European Pat. Off. |
| 3236545 | 5/1983 | Fed. Rep. of Germany |
| 2140310 | 1/1973 | France |
| 1406082 | 6/1972 | United Kingdom |
| 1406081 | 6/1972 | United Kingdom |

*Primary Examiner*—T. M. Tufariello
*Attorney, Agent, or Firm*—Hill, Van Santen, Steadman & Simpson

[57] ABSTRACT

An electroplating apparatus for plating plate-shaped workpieces, particularly printed circuit boards, as they move in a horizontal path through a tank of electrolyte between an upper anode and a lower anode characterized by the device including four electrolyte headers arranged with a pair at the input of the path between the upper and lower anodes, and a pair at the end of the path between the upper and lower anodes, with each pair having one header disposed above the path and one header disposed below the path. Each of the headers as a plurality of openings extending at an attack angle to the horizontal path to create both horizontal and vertical components for a flow of the electrolyte between the surfaces of the workpieces and each of the upper and lower anodes.

17 Claims, 1 Drawing Sheet

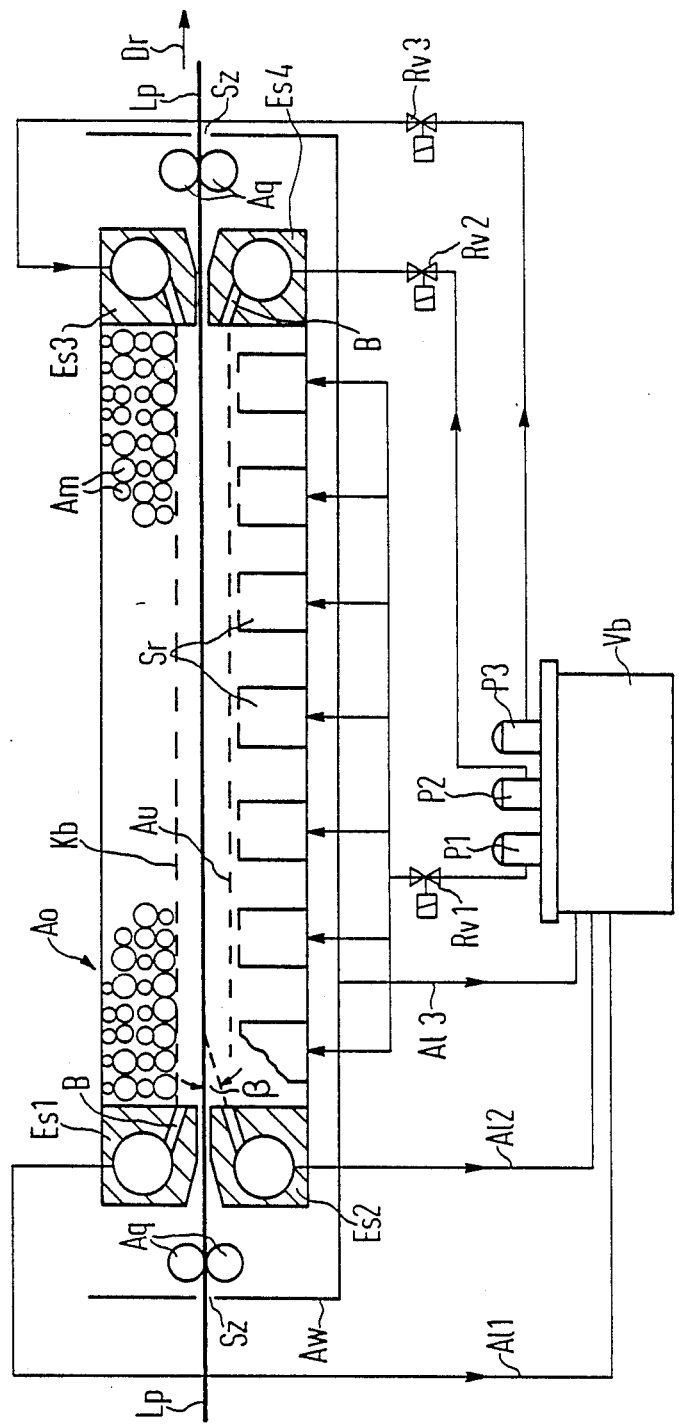

ELECTROPLATING APPARATUS FOR PLATE-SHAPED WORKPIECES, PARTICULARLY PRINTED CIRCUIT BOARDS

BACKGROUND OF THE INVENTION

The present invention is directed to an electroplating apparatus for plating plate-shaped workpieces, including perforated printed circuit boards, as the workpieces move through the apparatus along a horizontal path. The apparatus includes at least one electrode arranged above and at least one electrode arranged under the horizontal path and extending parallel thereto.

U.S. Pat. No. 4,385,967, whose disclosure is incorporated by reference, discloses an electroplating apparatus in which a plate member is moved in a horizontal path between an upper anode and a lower anode. The feed of the plate-shaped workpieces occurs via driven contact wheels which are arranged along one side of the bath and simultaneously assume the cathodic contacting of the workpiece. A special sliding fastening in the bath is arranged at that side, which lies opposite the contact wheels for guiding and holding the workpiece. The anode arranged in the electrolytic bath are soluble anodes rods which are aligned to extend transversey relative to the through-put horizontal path and are arranged both above as well as below the horizontal path. According to a modification, the upper and lower anodes, however, can also be formed by titanium baskets which contain the soluble anode material in the form of balls. Blast connections or jet connections, to which the electrolyte solution is supplied from a reservoir by means of a multitude of immersion pumps, are arranged in the collecting tank of the electroplating apparatus and extend aligned with the through-put direction above and below the horizontal through-put path. In addition to replenishing the bath zone to the desired level, the high flow rate of the electrolyte solution through these jets or connections also create a good, thorough mixing of the electrolyte solution, which is intended to guarantee a uniform composition and uniform current density. In order to create an even greater turbulence in the bath, the jet connections can also be moved back and forth horizontally or in the direction of travel of the workpiece through the bath.

SUMMARY OF THE INVENTION

The object of the present invention is to further improve the quality of electro-deposited layers in an electroplating apparatus, which utilizes soluble electrodes. Particularly, the improvement is for an apparatus in which perforated printed circuit boards are through-contacted and electroplated with a high-quality copper layer having good ductility, high adhesion and a uniform layer thickness distribution and which apparatus is capable of depositing such a layer with an even higher current density.

This object is achieved in an improvement in an electroplating apparatus for plate-shaped workpieces, including perforated printed circuit boards, said apparatus having an electrolytic bath with means for conducting the workpiece in a horizontal path through the bath, at least one anode arranged above the path and at least one anode arranged below the path. The improvements comprise headers being arranged within the bath, both above and below the horizontal path, said headers extending transversely relative to the direction of movement of a workpiece through the bath with a pair of headers being arranged adjacent the input of the path and a second pair being arranged adjacent the output of the path, each of said headers having a plurality of spaced openings to enable the flow of the electrolyte from the header into the bath as the electrolyte flows along the surfaces of the workpiece and between the upper and lower anodes.

The invention is based on the perception that qualitatively high-grade surfaces of the electro-deposited layers can be guaranteed only by flow components of the electrolyte liquid directed along the horizontal through-put path of the workpieces through the bath and such flow components in the longitudinal direction can be realized with the inventive arrangement of electrolyte headers. However, there are vertical flow components directed onto the surface of the workpiece which should not be supressed, since these are important for the continued manufacture of through-contacts in the perforated printed circuit board.

The flow components in a longitudinal direction can be generated both by directing electrolyte into the bath between the upper and lower anodes and the respective surfaces of the workpiece and also by removing electrolyte flowing between the anodes and the respective surfaces of the workpiece by utilizing electrolyte headers. Especially beneficial results, however, are achieved when at least one of the electrolyte headers is intended for the introduction of the electrolyte solutions into the path.

According to a preferred embodiment of the invention, two electrolyte headers are intended for introducing the electrolyte into the bath and two electrolyte headers are intended for the removal of the electrolyte solution. In other words, this means that a flow component is created which is opposite to the direction of movement of the workpiece on the horizontal, longitudinal direction.

It has also proven very beneficial, particularly for a good flooding of the holes in the printed circuit board, when the electrolyte solution is supplied to the two electrolyte headers, which are intended for introducing the electrolyte by separate pumps. An especially effective flooding of the holes can be achieved in that a greater quantity of electrolyte solution is supplied to the electrolyte header arranged under the horizontal through-put path. This is particularly advantageous when the workpieces are to be additionally washed from below.

It is provided in accordance with a further development of the invention that the openings are obliquely directed onto the through-put path at a slight angle of attack. As a result of this measure, which is easy to realize in structural terms, the introduction, as well as the removal orifices of the openings can, thus, be brought very close to the surface of the passing workpiece.

It has proven advantageous when the openings are introduced into the electrolyte headers in the form of bores which are uniformly arranged over the width of the through-put path. Given a low structural outlay in comparison to through slots in a transverse direction, such openings enable a more uniform distribution of the desired flow components.

In view of an optimum flooding of the holes in the perforated printed circuit boards, it is also expedient when a plurality of the wash nozzles, that extend transversely relative to the through-put path and are chargeable with electrolyte solution, are arranged between the two electrolyte headers arranged under the through-put path and below an insoluble lower anode fashioned as a sieve-like or lattice-like structure. The accommodation of the wash nozzles in the electrolyte bath is, thus, considerably facilitated by the sieve-like or lattice-like structure of the insoluble, lower anode. The wash nozzles are then, preferably, constructed as slotted tubes which have proven more beneficial in the arrangement for through-flooding than bores. When the wash nozzles can be charged with electrolytic solution via a separate pump, then the condition of the electrolyte movement can be even further optimized overall and can be adapted to the respective characteristics of the workpiece to be treated.

Finally, it has also proven especially beneficial when the upper anode is fashioned as a soluble anode comprising soluble anode materials arranged on a sieve-like or lattice-shape carrier. The advantages of soluble anodes are, thus, also achieved whereby constant spacing to the passing workpiece is simultaneously guaranteed. Particularly on the basis of the combination of such an upper anode with an insoluble, lower anode, conditions in view of the range of layer thicknesses and of the distribution of the layer thickness on a surface of the workpiece are achieved given simple maintenance of the electroplating apparatus.

Other advantages and features of the present invention will be readily apparent from the following description of the preferred embodiments, the drawing and the claims.

BRIEF DESCRIPTION OF THE DRAWING

The FIGURE is a schematic, across sectional view an electroplating apparatus in accordance with the present invention, with a flow circuit diagram for the electrolyte.

DESCRIPTION OF THE PREFERRED EMBODIMENTS

The principles of the present invention are particularly useful in the apparatus of the FIGURE, which has a collecting tank or electrolyte bath Aw. As illustrated in the drawing, individual, perforated printed circuit boards Lp, which form a sheet-like workpiece to be electroplated, are successfully conducted through the electrolyte solution contained in the bath or collecting tank Aw. As illustrated, the workpieces Lp move in the horizontal through-put path in a through-put direction Dr through a horizontal slot Sz at the admission side, which is illustrated on the left-hand side of the Figure, to pass between a pair of squeegee rolers Aq and are then conducted through the electrolyte solution between an upper anode, generally indicated at Ao, and a lower anode Au, with the assistance of conventional conveyor means, which are not illustrated in detail. The workpieces Lp depart the electroplating apparatus by passing between a pair of squeegee rollers Aq at the discharge end and via a horizontal discharge slot Sz of the collecting tank Aw. The individual circuit boards Lp are cathodically contacted via conventional contacting devices, which are not shown in detail, and are at least contacted while passing between the upper anode Ao and the lower anode Au.

The upper anode Ao is arranged horizontally at a slight distance above the through-put path of the printed circuit boards Lp and is a soluble anode which is composed of a basket Kb and of an anode material Am, which is arranged in one or more layers. The rib-mesh floor of the basket Kb, which is formed of titanium, forms a carrier for the anode material Am, which allows the electrolyte solution to easily pass through the anode Ao. In the present case, the electrolyte solution is a copper bath and the anode material Am is formed of copper balls, which are also frequently referred to as copper pellets.

The horizontally positioned, lower anode Au is fashioned as an insoluble anode and is arranged at a slight distance under the through-put path of the printed circuit boards Lp. Preferably, the lower anode Au is formed of a rib-mesh sieve of platinum-plated titanium so that neither the electrolyte exchange nor the flow of the electrolyte solution is impeded or greatly reduced. Moreover, the illustrated combination of the soluble upper anode Ao and the insoluble lower anode Au has the advantage that the distance from the printed circuit board Lp passing therebetween remains constant and, thus, optimum conditions can be obtained in view of the range of the layer thicknesses and of the distribution of the layer thicknesses on the surface of the workpiece.

Special demands are made of electrolyte movement in order to guarantee a deposition of a shiny, copper layer and an electroplating build-up of the interconnects and through-contacts of the printed circuit board Lp. To this end, a plurality of slotted tubes Sr, which extend transversely relative to the through-put path, are arranged in the region under the lower anode Au. These slotted tubes Sr are charged with an electrolyte solution from a reservoir Vb via a pump P1 so that the quantity can be varied via a regulating valve Rv1. The slots of the slotted tubes Sr are, therefore, aligned so that the printed circuit boards Lp are essentially flooded in a vertical direction proceeding from below.

Since the slotted tubes Sr alone do not guarantee a deposition of shiny, copper layers, respective electrolyte headers Es1, Es2, Es3 and Es4 are additionally provided above and below the through-put path and extend transversely relative thereto. Two of these headers Es1 and Es2 are arranged at the input or admission end of the electrodes, while the headers Es3 and Es4 are arranged at the discharge end of the horizontal path just prior to the workpieces being discharged out of the collecting tank. Each of the headers Es1 –Es4 has a plurality of bores B, which are uniformly arranged over the width of the through-put path, and these bores are obliquely directed onto the through-put path at a slight attack angle $\beta$ which may be, for example, 10° and are further directed into the gap-shaped region between the horizontal path for the workpieces Lp and the surface of the upper anode Ao and the horizontal path and the surface of the lower electrode Au.

The electrolyte header Es4 arranged adjacent the discharge or output end of the through-put path is charged with electrolyte solution from a reservoir, such as the reservoir Vb via a pump P2 so that the quanitity can be varied with a regulating valve Rv2 in the line from the pump P2. The supplied electrolyte solution then emerges from the bores B of the electrolyte header Es4 with an essentially horizontal speed component, which is directed at the under surface of the printed circuit board Lp and proceeds opposite to the through-put direction Dr. The electrolyte header Es3, which is arranged above the through-put path at the discharge or outlet side of the anode, is charged with an electrolyte solution from the reservoir Vb via pump P3, whose discharge line also has a regulator Rv3 so that the quanitity of the electrolyte solution can be regulated. The supply of electrolyte solution then emerges from the bores B of the electrolyte header Es3 with an essentially horizontal speed component which is directed on an upper surface of the printed circuit boards Lp and also is directed opposite to the through-put direction Dr.

The horizontal speed components of the electrolyte at the upper surface and the lower surface of the printed circuit board Lp are further promoted by the electrolyte headers Es1 and Es2, respectively, which are adjacent the input or admission side. These headers are intended for removal of electrolyte solution and are connected to the reservoir Vp by discharge lines A11 and A12, respectively. For further improvement of the electrolyte circulation, the collecting tank Aw is also connected to the reservoir Vb via a discharge line A13.

In the illustrated embodiment set forth above, an electrolyte motion having extremely good flooding of the holes of the printed circuit board Lp and having a strong electrolyte flow along the surfaces of the printed circuit boards is achieved. The following parameters are thereby set. The through-put pump P1 pumps at a rate of 5000 Liters/hours with an exit speed of 3.6 m/sec. The through-put pump P2 pumps at a rate of 8000 Liters/hours, with an exit speed of 4.1 m/sec. The through-put pump P3 pumps at a rate 12,000 Liters/hours at an exit speed of 6.2 m/sec.

The exemplary embodiment which has been set forth merely represents a preferred, first possibility of the electrolyte motion with the assistance of the electrolyte headers Es1–Es4 and the slotted tubes Sr. Further possibilities which, however, are not intended to represent a subsequent enumeration, proceed from the following table.

|  | Es1 | Es2 | Es3 | Es4 | Sr |
| --- | --- | --- | --- | --- | --- |
| First Possibility | Exhaust | Exhaust | Input | Input | Input |
| Second Possiblity | Input | Input | Exhaust | Exhaust | Input |
| Third Possibility | Exhaust | Input | Exhaust | Input | Input |
| Fourth Possibility | Input | Exhaust | Exhaust | Input | Input |

As can be seen, the inventive arrangement of the electrolyte headers enables a broad range of influence of the electrolyte solution and a flexible adaptation of the respective workpieces to be electroplated. Although various minor modifications may be suggested by those versed in the art, it should be understood that I wish to embody with the scope of the patent granted hereon all such modifications as reasonably and properly come within the scope my contribution to the art.

I claim:

1. In an electroplating apparatus for electroplating plate-shaped workpieces, including perforated printed circuit boards, as the workpieces move in a horizontal through-put path, said apparatus comprising a bath containing electrolyte with the through-put horizontal path therethrough with at least one anode arranged above the horizontal path of the workpieces through said bath and at least one anode arranged below the path of the workpieces through said bath, the improvements comprising four electrolyte headers, with one pair of said headers being arranged at an input of the path between said upper and lower anodes and a second pair of said headers being arranged at a discharge end of the path, each of said headers extending transversely relative to a direction of movement of the workpieces along the horizontal path, said electrolyte headers having a plurality of openings for the flow of an electrolyte solution between surfaces of the workpieces and said upper and lower anodes.

2. In a electroplating apparatus according to claim 1, wherein a first of said electrolyte headers is connected to a first means for inducing a flow of electrolyte solution through said first header into said bath.

3. In an electroplating apparatus according to claim 2, wherein a second of said headers is connected to second means for creating a flow of electrolyte into said second header and into said bath, and remaining two of said four headers being connected to means for removing flow through said headers for withdrawing electrolyte solution from said bath.

4. In an electroplating apparatur according to claim 3, wherein said first and second headers are said second pair and are arranged adjacent said discharge end of the horizontal path between said upper and lower anodes.

5. In an electroplating apparatus according to claim 4, wherein said first and second means for supplying said first and second headers each include a separate pump so that rate of flow in said first and second headers can be adjusted to be mutually different.

6. In an electroplating apparatus according to claim 5, wherein said first header is arranged above the through-put path and said first means is capable of supplying a greater quantity of electrolyte solution than said second means which is connected to said second header arranged beneath the horizontal path.

7. In an electroplating apparatus according to claim 6, wherein each of said plurality of openings is obliquely directed at the horizontal path at a slight attack angle.

8. In an electroplating apparatus according to claim 1, wherein each of said plurality of openings is obliquely directed at the horizontal path at a slight attack angle.

9. In an electroplating apparatus according to claim 1, wherein said plurality of openings of each of said electrolyte headers are in the form of bores uniformly arranged along a width of the horizontal path.

10. In an electroplating apparatus for electroplating plate-shape workpieces, including perforated printed circuit boards, as the workpieces move in a horizontal through-put path, said apparatus comprising a bath containing electrolyte with the through-put path therethrough with least one anode arranged above the horizontal path the workpieces through said bath and at least one anode arranged below the path of the workpieces through said bath, the improvements comprising four electrolyte headers, with one pair of said headers being arranged at an input of the path between said upper and lower anodes and a second pair of said headers being arranged at a discharge end of the path, each of said headers extending transversely relative to a direction of movement of the workpieces along the horizontal path, said electrolyte headers having a plurality of openings for the flow of an electrolyte solution between surfaces of the workpieces and said upper and lower anodes, wherein said lower anode is an insoluble anode constructed with a sieve-like construction having openings, at least in the portion extending between said electrolyte headers at the input and output of the horizontal path between said anodes, and said apparatus includes a plurality of wash nozzles arranged beneath said lower anode, each of said wash nozzles extending transversely relative to the direction of movement of the workpiece on the horizontal path and having openings directed at said sieve-like lower anode, each of said wash nozzles being connected to a source of electrolyte under pressure so that electrolyte will flow through said nozzles and said sieve-like anode onto the workpiece as it moves along the horizontal path.

11. In an electroplating apparatus according to claim 10, wherein said plurality of wash nozzles are constructed as tubes having a slot extending the length thereof.

12. In an electroplating apparatus according to claim 10, wherein said source of electrolyte includes a separate pump.

13. In an electroplating apparatus according to claim 10, wherein said upper anode is constructed as a soluble anode having a sieve-shaped carrier containing a soluble anode material.

14. In an electroplating apparatus according to claim 1, wherein said upper anode is fashioned as a soluble anode having a sieve-shaped carrier containing a soluble anode material.

15. In an electroplating apparatus according to claim 1, wherein at least two of said four electrolyte headers are connected to means for removing fluid from said bath into a sump, and a remaining two of said electrolyte headers are connected to means for pumping electrolyte from said sump through said remaining two headers for admission into the bath.

16. In an electroplating apparatus according to claim 15, wherein each of said headers has openings extending obliquely to the direction of movement through the path at a slight attack angle.

17. In an electroplating apparatus according to claim 16, wherein said opening in said electrolyte headers are in the form of bores uniformly arranged along the width of a horizontal path.

* * * * *